(12) United States Patent
Chen et al.

(10) Patent No.: US 12,332,313 B2
(45) Date of Patent: Jun. 17, 2025

(54) FAULT DIAGNOSIS METHOD, ELECTRONIC DEVICE, AND STORAGE MEDIUM

(71) Applicant: Huawei Technologies Co., Ltd., Shenzhen (CN)

(72) Inventors: Pinhui Chen, Dongguan (CN); Weicai Zeng, Dongguan (CN); Yuanji He, Dongguan (CN); Bo Xie, Dongguan (CN); Xiujiang Ma, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 236 days.

(21) Appl. No.: 18/007,944

(22) PCT Filed: Apr. 6, 2021

(86) PCT No.: PCT/CN2021/085657
§ 371 (c)(1),
(2) Date: Dec. 2, 2022

(87) PCT Pub. No.: WO2021/244130
PCT Pub. Date: Dec. 9, 2021

(65) Prior Publication Data
US 2023/0228818 A1    Jul. 20, 2023

(30) Foreign Application Priority Data

Jun. 4, 2020  (CN) .......................... 202010497560.8

(51) Int. Cl.
*G01R 31/327*   (2006.01)
*G01R 19/165*   (2006.01)
(Continued)

(52) U.S. Cl.
CPC ....... *G01R 31/3278* (2013.01); *G01R 19/165* (2013.01); *G01R 31/006* (2013.01);
(Continued)

(58) Field of Classification Search
CPC ......................... G01R 31/3278; G01R 19/165; G01R 31/006; G01R 31/2822; H04B 17/17; H04B 7/15; H04B 17/409
(Continued)

(56) References Cited

U.S. PATENT DOCUMENTS

2009/0089134 A1   4/2009  Uyeki
2014/0121888 A1   5/2014  Guo et al.
(Continued)

FOREIGN PATENT DOCUMENTS

CN    104655947 A    5/2015
CN    104704777 A    6/2015
(Continued)

OTHER PUBLICATIONS

DE 102008048107 machine translation, Apr. 9, 2009 (Year: 2009).*

*Primary Examiner* — Raul J Rios Russo
(74) *Attorney, Agent, or Firm* — Conley Rose, P.C.

(57) ABSTRACT

A fault diagnosis method includes detecting a state of a relay device, sending a fault diagnosis trigger signal to the relay device based on the state to enable the relay device to enter a fault diagnosis mode, where the fault diagnosis trigger signal includes one or more of a variable supply voltage value, a transmit/receive control signal, and a diagnosis control signal, detecting a state of the relay device in the fault diagnosis mode, determining a fault code based on the state, and determining a fault based on the fault code.

20 Claims, 10 Drawing Sheets

(51) Int. Cl.
  *G01R 31/00* (2006.01)
  *G01R 31/28* (2006.01)
  *H04B 7/15* (2006.01)
  *H04B 17/17* (2015.01)

(52) U.S. Cl.
  CPC ............ *G01R 31/2822* (2013.01); *H04B 7/15* (2013.01); *H04B 17/17* (2015.01)

(58) Field of Classification Search
  USPC ........................................................ 324/418
  See application file for complete search history.

(56) References Cited

U.S. PATENT DOCUMENTS

| | | | |
|---|---|---|---|
| 2014/0351460 | A1 | 11/2014 | Tsuboi et al. |
| 2018/0113170 | A1* | 4/2018 | Liu ...................... G01R 31/327 |
| 2018/0351345 | A1* | 12/2018 | Matsumoto ............ G01R 31/52 |
| 2018/0361961 | A1* | 12/2018 | Maekawa ............. H01M 10/44 |
| 2019/0248242 | A1* | 8/2019 | Youn ...................... G01R 31/66 |
| 2021/0349158 | A1* | 11/2021 | Wu ......................... H02M 1/32 |
| 2022/0129338 | A1* | 4/2022 | Zhang ................ G06F 11/0751 |

FOREIGN PATENT DOCUMENTS

| | | |
|---|---|---|
| CN | 104977170 A | 10/2015 |
| CN | 106814724 A | 6/2017 |
| CN | 109164789 A | 1/2019 |
| CN | 109164795 A | 1/2019 |
| CN | 111124965 A | 5/2020 |
| DE | 102008048107 A1 | 4/2009 |

\* cited by examiner

FAULT DIAGNOSIS METHOD, ELECTRONIC DEVICE, AND STORAGE MEDIUM

CROSS-REFERENCE TO RELATED APPLICATIONS

This is a U.S. National Stage of International Patent Application No. PCT/CN2021/085657 filed on Apr. 6, 2021, which claims priority to Chinese Patent Application No. 202010497560.8 filed on Jun. 4, 2020. The disclosures of the aforementioned applications are hereby incorporated by reference in their entireties.

TECHNICAL FIELD

Embodiments of this application relate to the field of communication technologies, and in particular, to a fault diagnosis method, an electronic device, and a storage medium.

BACKGROUND

A conventional in-vehicle mobile communication system generally includes an in-vehicle terminal and an antenna. A radio frequency signal is generated in the in-vehicle terminal, and the radio frequency signal may be sent by using the antenna. In addition, the antenna may also receive a radio frequency signal, and feed back the radio frequency signal to the in-vehicle terminal. In this case, information sending and receiving of the in-vehicle terminal are completed. In this scenario, the in-vehicle terminal may perform fault diagnosis on the antenna through direct current voltage division.

However, the in-vehicle terminal is connected to the antenna by using a radio frequency coaxial cable. In some high-frequency applications, for example, in a vehicle-to-everything (Vehicle to everything, V2X) scenario, a relay amplifier generally needs to be added between the in-vehicle terminal and the antenna, to compensate for a loss caused by a long cable. However, because the relay amplifier is introduced, the in-vehicle terminal cannot continue to perform fault diagnosis through direct current voltage division.

SUMMARY

Embodiments of this application provide a fault diagnosis method, an electronic device, and a storage medium, to provide a fault diagnosis manner. An in-vehicle terminal negotiates with a relay amplifier about a diagnosis start moment, and after the start moment, the relay amplifier sends a fault code to the in-vehicle terminal, so that the in-vehicle terminal performs fault diagnosis. In this way, a problem that a fault of the relay amplifier and a fault of an antenna cannot be diagnosed in a relay amplifier scenario can be resolved.

According to a first aspect, an embodiment of this application provides a fault diagnosis method, including:
  detecting a state of a relay device, and sending a fault diagnosis trigger signal to the relay device based on the state, so that the relay device enters a fault diagnosis mode, where the fault diagnosis trigger signal includes one or more of a variable supply voltage value, a transmit/receive control signal, and a diagnosis control signal, specifically, the relay device may be a relay amplifier or another relay amplification device, and the state may include a power supply current state of the relay device, for example, whether a power supply current value of the relay device is abnormal; and
  detecting a state of the relay device in the fault diagnosis mode, determining a fault code based on the state, and determining a fault based on the fault code, where specifically, the state may include a power supply current value of the relay device in each transmit period, and the fault code may include the power supply current value.

In a possible implementation, the detecting a state of a relay device, and sending a fault diagnosis trigger signal to the relay device based on the state includes:
  detecting a relay power supply current $V_{TX}$ in any transmit period and a relay power supply current $V_{RX}$ in any receive period; and
  if $V_{TX}$ is less than a preset first threshold, or $V_{TX}$ is greater than a preset second threshold, or $V_{RX}$ is less than a preset third threshold, or $V_{RX}$ is greater than a preset fourth threshold, sending the fault diagnosis trigger signal to the relay device.

In a possible implementation, the detecting a state of a relay device, and sending a fault diagnosis trigger signal to the relay device based on the state includes:
  detecting a state of a transmit path of the relay device in any transmit period, where specifically, the transmit path may be a transmit circuit of the relay device, and the relay device may turn on or turn off the transmit circuit, to connect or disconnect the transmit circuit; and
  if the transmit path is in an abnormal state, sending the fault diagnosis trigger signal to the relay device, where specifically, the abnormal state may include that the transmit path is in a disconnected state, that is, the relay device turns off the transmit path.

In a possible implementation, the sending a fault diagnosis trigger signal to the relay device based on the state includes:
  adjusting the variable supply voltage value based on the state, and sending the variable supply voltage value to the relay device, where specifically, the variable supply voltage value may be changed by adjusting an output voltage of a variable power supply unit; or
  adjusting an output duty cycle of the transmit/receive control signal based on the state, and sending the transmit/receive control signal to the relay device, where specifically, the output duty cycle of the control signal may be adjusted by adjusting duration of an output level, for example, duration of an output high level of the control signal may be increased.

In a possible implementation, the detecting a state of the relay device in the fault diagnosis mode, and determining a fault code based on the state includes:
  detecting a relay power supply current $V_{TX}$ of the relay device in any transmit period in the fault diagnosis mode;
  if $V_{TX}$ is less than a preset fifth threshold, determining a first code, where specifically, the first code may be an integer, for example, the first code may be 0; or
  if $V_{TX}$ is greater than or equal to a preset fifth threshold, determining a second code, where specifically, the second code may be an integer, for example, the second code may be 1; and
  obtaining a code set in M consecutive transmit periods, and determining the fault code based on the code set, where the code set includes at least one of the first code and the second code, specifically, codes in several consecutive transmit periods may be combined to form a string of codes, and the string of codes is the fault code, for example, the fault code is 10111, and the fault code may correspond to a preset fault description.

In a possible implementation, the obtaining a code set in M consecutive transmit periods, and determining the fault code based on the code set includes:

obtaining a first code set of the relay device from a first transmit period to an $N^{th}$ transmit period in the fault diagnosis mode, where the first code set includes at least one of the first code and the second code, specifically, a code set, namely, the first code set, in the first N transmit periods may be first obtained, and the first code set may be used to perform a handshake between the relay device and an in-vehicle terminal device;

if the first code set matches a preset code set, obtaining a second code set from an $(N+1)^{th}$ transmit period to an $(N+M)^{th}$ transmit period, where the second code set includes at least one of the first code and the second code, specifically, if the code set in the first N transmit periods matches the preset handshake code set, it indicates that moments of the in-vehicle terminal device and the relay device have been aligned, and the in-vehicle terminal device may receive codes in the following M transmit periods, to obtain the second code set, and therefore may determine the fault code based on the second code set; and determining the fault code based on the second code set.

According to a second aspect, an embodiment of this application provides a fault diagnosis apparatus, including:

a detection module, configured to: detect a state of a relay device, and send a fault diagnosis trigger signal to the relay device based on the state, so that the relay device enters a fault diagnosis mode, where the fault diagnosis trigger signal includes one or more of a variable supply voltage value, a transmit/receive control signal, and a diagnosis control signal; and a diagnosis module, configured to: detect a state of the relay device in the fault diagnosis mode, determine a fault code based on the state, and determine a fault based on the fault code.

In a possible implementation, the detection module includes:

a detection unit, configured to detect a relay power supply current $V_{TX}$ in any transmit period and a relay power supply current $V_{RX}$ in any receive period; and a sending unit, configured to: if $V_{TX}$ is less than a preset first threshold, or $V_{TX}$ is greater than a preset second threshold, or $V_{RX}$ is less than a preset third threshold, or $V_{RX}$ is greater than a preset fourth threshold, send the fault diagnosis trigger signal to the relay device.

In a possible implementation, the detection module includes:

a detection unit, configured to detect a state of a transmit path of the relay device in any transmit period; and a sending unit, configured to: if the transmit path is in an abnormal state, send the fault diagnosis trigger signal to the relay device.

In a possible implementation, the detection module is further configured to: adjust the variable supply voltage value based on the state, and send the variable supply voltage value to the relay device; or adjust an output duty cycle of the transmit/receive control signal based on the state, and send the transmit/receive control signal to the relay device.

In a possible implementation, the diagnosis module includes:

a detection unit, configured to detect a relay power supply current $V_{TX}$ of the relay device in any transmit period in the fault diagnosis mode;

a comparison unit, configured to: if $V_{TX}$ is less than a preset fifth threshold, determine a first code; or if $V_{TX}$ is greater than or equal to a preset fifth threshold, determine a second code; and a diagnosis unit, configured to: obtain a code set in M consecutive transmit periods, and determine the fault code based on the code set, where the code set includes at least one of the first code and the second code.

In a possible implementation, the diagnosis unit includes:

an obtaining subunit, configured to obtain a first code set of the relay device from a first transmit period to an $N^{th}$ transmit period in the fault diagnosis mode, where the first code set includes at least one of the first code and the second code;

a matching subunit, configured to: if the first code set matches a preset code set, obtain a second code set from an $(N+1)^{th}$ transmit period to an $(N+M)^{th}$ transmit period, where the second code set includes at least one of the first code and the second code; and a diagnosis subunit, configured to determine the fault code based on the second code set.

According to a third aspect, an embodiment of this application provides an electronic device, including:

a memory, where the memory is configured to store a computer program code, the computer program code includes instructions, and when the device reads the instructions from the memory, the device is enabled to perform the following steps:

detecting a state of a relay device, and sending a fault diagnosis trigger signal to the relay device based on the state, so that the relay device enters a fault diagnosis mode, where the fault diagnosis trigger signal includes one or more of a variable supply voltage value, a transmit/receive control signal, and a diagnosis control signal; and detecting a state of the relay device in the fault diagnosis mode, determining a fault code based on the state, and determining a fault based on the fault code.

In a possible implementation, that the instructions are executed by the device to enable the device to perform the step of detecting a state of a relay device and sending a fault diagnosis trigger signal to the relay device based on the state includes:

detecting a relay power supply current $V_{TX}$ in any transmit period and a relay power supply current $V_{RX}$ in any receive period; and if $V_{TX}$ is less than a preset first threshold, or $V_{TX}$ is greater than a preset second threshold, or $V_{RX}$ is less than a preset third threshold, or $V_{RX}$ is greater than a preset fourth threshold, sending the fault diagnosis trigger signal to the relay device.

In a possible implementation, that the instructions are executed by the device to enable the device to perform the step of detecting a state of a relay device and sending a fault diagnosis trigger signal to the relay device based on the state includes:

detecting a state of a transmit path of the relay device in any transmit period; and if the transmit path is in an abnormal state, sending the fault diagnosis trigger signal to the relay device.

In a possible implementation, that the instructions are executed by the device to enable the device to perform the step of sending a fault diagnosis trigger signal to the relay device based on the state includes:

adjusting the variable supply voltage value based on the state, and sending the variable supply voltage value to the relay device; or adjusting an output duty cycle of the transmit/receive control signal based on the state, and sending the transmit/receive control signal to the relay device.

In a possible implementation, that the instructions are executed by the device to enable the device to perform the step of detecting a state of the relay device in the fault diagnosis mode and determining a fault code based on the state includes:

detecting a relay power supply current $V_{TX}$ of the relay device in any transmit period in the fault diagnosis mode;

if $V_{TX}$ is less than a preset fifth threshold, determining a first code; or if $V_{TX}$ is greater than or equal to a preset fifth threshold, determining a second code; and obtaining a code set in M consecutive transmit periods, and determining the fault code based on the code set, where the code set includes at least one of the first code and the second code.

In a possible implementation, that the instructions are executed by the device to enable the device to perform the step of obtaining a code set in M consecutive transmit periods and determining the fault code based on the code includes:

obtaining a first code set of the relay device from a first transmit period to an $N^{th}$ transmit period in the fault diagnosis mode, where the first code set includes at least one of the first code and the second code;

if the first code set matches a preset code set, obtaining a second code set from an $(N+1)^{th}$ transmit period to an $(N+M)^{th}$ transmit period, where the second code set includes at least one of the first code and the second code; and determining the fault code based on the second code set.

According to a fourth aspect, this application provides a computer-readable storage medium, where the computer-readable storage medium stores a computer program, and when the computer program is run on a computer, the computer is enabled to perform the method in the first aspect.

DESCRIPTION OF EMBODIMENTS

The following describes technical solutions in embodiments of this application with reference to the accompanying drawings in embodiments of this application. In the descriptions of embodiments of this application, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists.

The terms "first" and "second" mentioned below are merely intended for a purpose of description, and shall not be understood as an indication or implication of relative importance or implicit indication of the quantity of indicated technical features. Therefore, a feature limited by "first" or "second" may explicitly indicate or implicitly include one or more such features. In the description of embodiments of this application, unless otherwise stated, "a plurality of" means two or more than two.

Figure 1A:
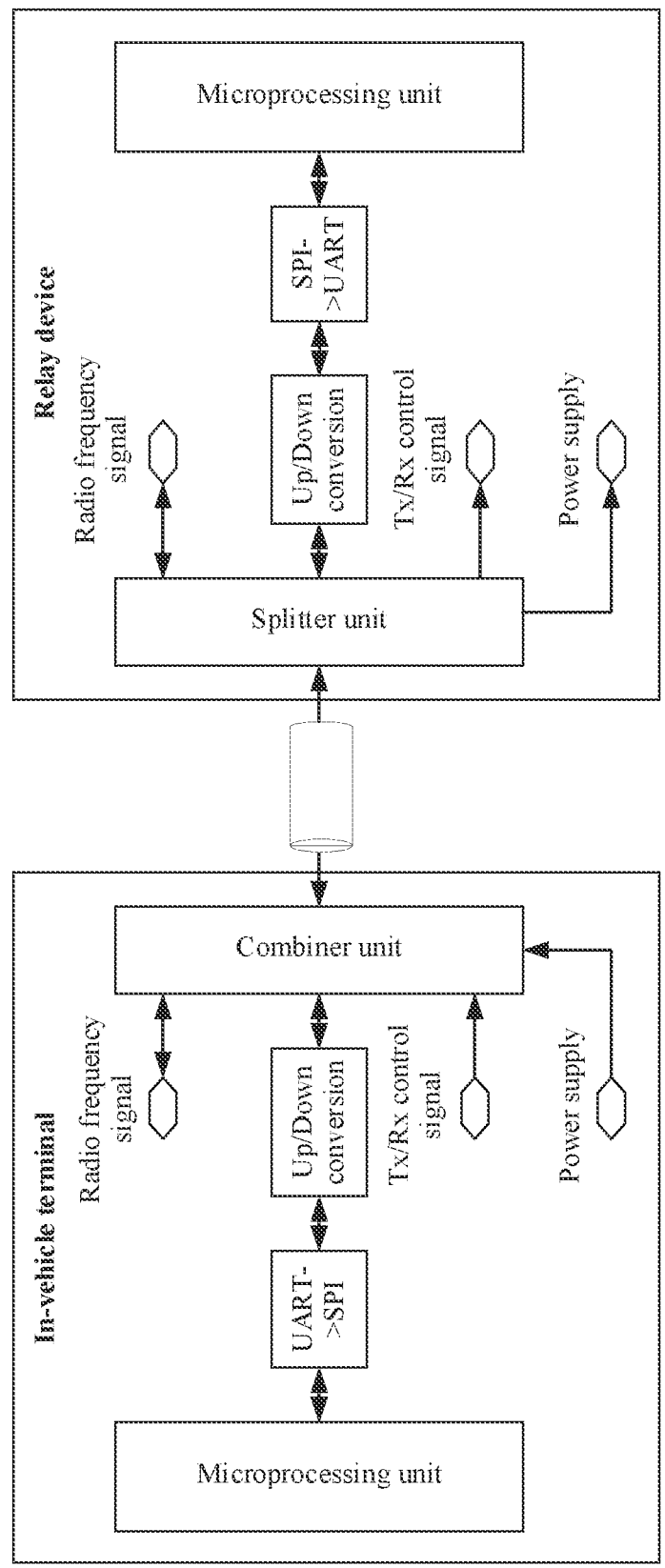
FIG. 1A is a schematic diagram of a circuit structure of an in-vehicle terminal and an external antenna according to an embodiment of this application.
Figure 1B:
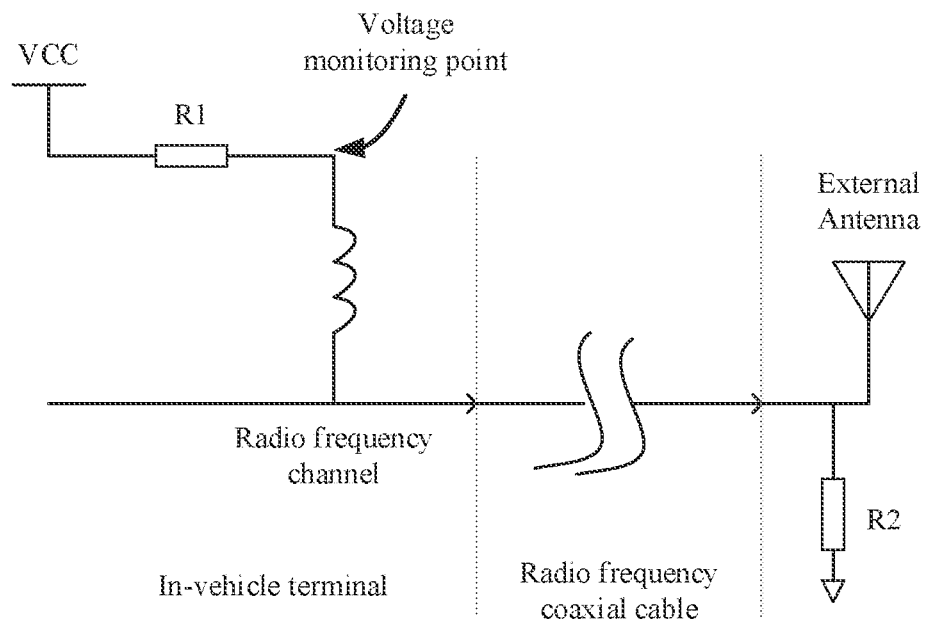
FIG. 1B is a schematic diagram of another circuit structure of an in-vehicle terminal and an external antenna according to an embodiment of this application.

A conventional in-vehicle mobile communication system generally includes an in-vehicle terminal and an antenna. The in-vehicle terminal is directly connected to the external antenna, and may perform fault diagnosis on the antenna through direct current voltage division. FIG. 1A shows a circuit manner of the in-vehicle terminal and the external antenna FIG. 1B shows another circuit manner of the in-vehicle terminal and the external antenna. A fault between a voltage detection point and a resistor R2 may be detected by using the circuit.

Currently, a relay amplifier is generally added between the in-vehicle terminal and the antenna to compensate for a loss of a line. In this scenario, the in-vehicle terminal supplies power to the relay amplifier by using a radio frequency coaxial cable. Therefore, the circuit in FIG. 1A has the following disadvantage: The in-vehicle terminal requires an additional digital communication interface such as a universal asynchronous receiver/transmitter (Universal Asynchronous Receiver/Transmitter, UART) and a serial peripheral interface (Serial Peripheral Interface, SPI), performs frequency modulation (up/down conversion) on the digital communication interface signal, and then combines, with a radio frequency signal unit by using the combiner unit, the digital communication interface signal on which frequency modulation is performed, for transmission by the radio frequency coaxial cable. The system is complex and difficult to implement. In addition, the relay device requires a same conversion circuit to implement information exchange. For the circuit in FIG. 1B, because the relay amplifier is introduced, a fault of the relay amplifier and a fault of the antenna cannot be separately detected.

Based on the foregoing problem, embodiments of this application provide a fault diagnosis method.

The technical solutions provided in embodiments of this application may be applied to an in-vehicle terminal. A specific form of the in-vehicle terminal that executes the technical solutions is not specially limited in this application.

Figure 2:
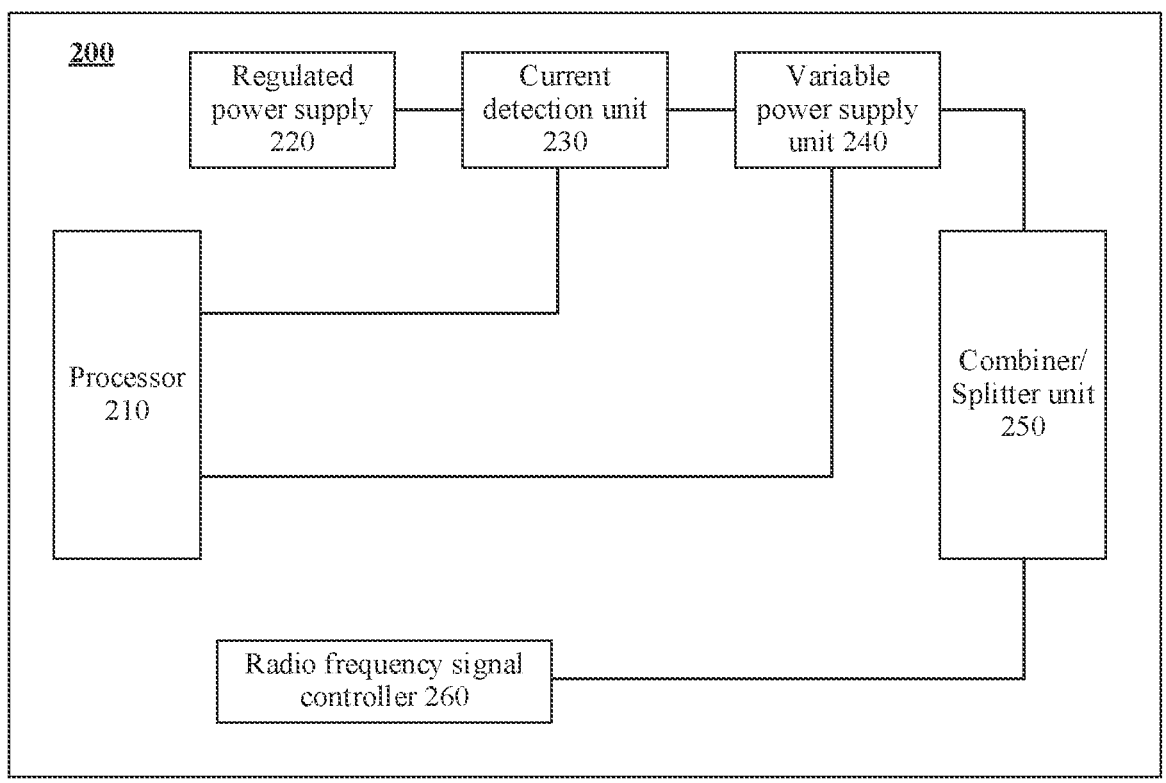
FIG. 2 is a schematic diagram of a structure of an embodiment of an electronic device according to this application.
Figure 3:
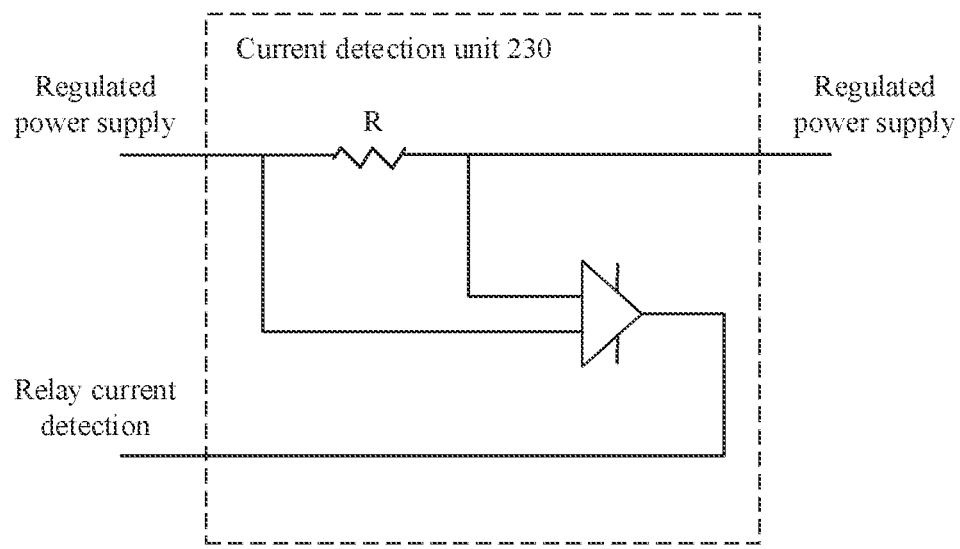
FIG. 3 is a schematic diagram of a circuit structure of a current detection unit according to an embodiment of this application.
Figure 4:
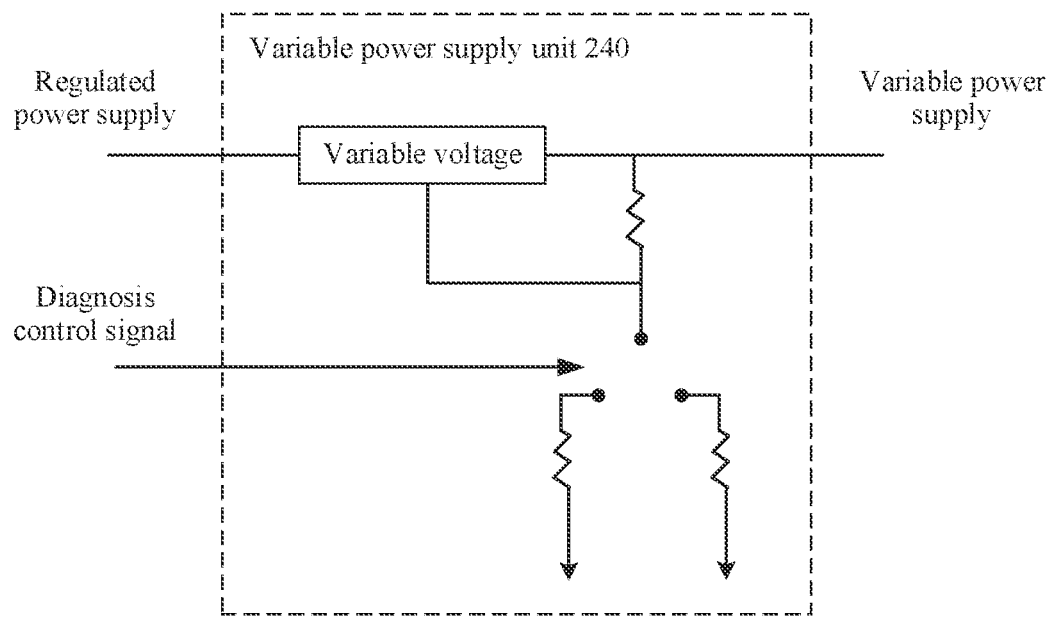
FIG. 4 is a schematic diagram of a circuit structure of a variable power supply unit according to an embodiment of this application.
Figure 5:
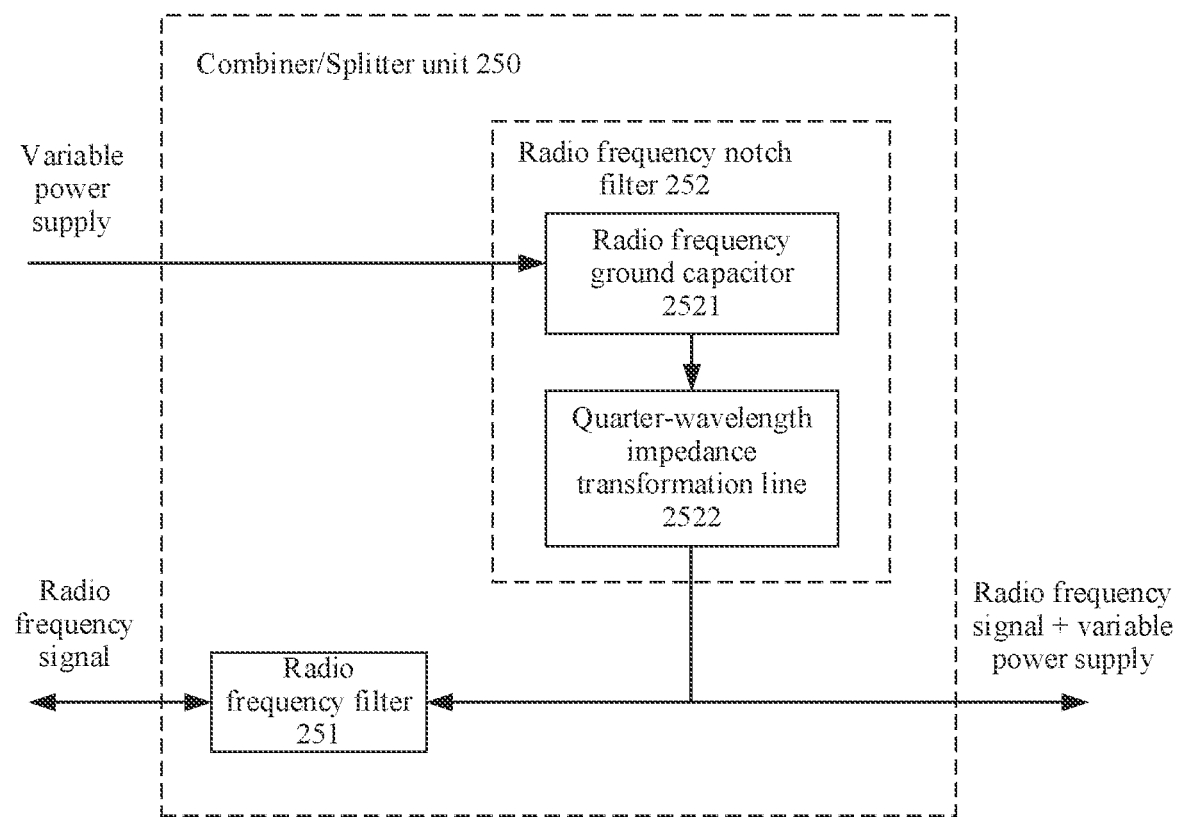
FIG. 5 is a schematic diagram of a circuit structure of a combiner/splitter unit according to an embodiment of this application.

FIG. 2 is a schematic diagram of a structure of an electronic device 200 according to an embodiment of this application. The electronic device may be an in-vehicle terminal, and the electronic device 200 may include a processor 210, a regulated power supply 220, a current detection unit 230, a variable power supply unit 240, a combiner/splitter unit 250, and a radio frequency signal controller 260. The current detection unit 230, the variable power supply unit 240, and the processor 210 may communicate with each other by using an internal connection path, to transmit a control signal and/or a data signal. The processor 210 may be configured to: receive a data signal of the current detection unit 230, generate a control signal based on the data signal, and send the control signal to the variable power supply unit 240. In specific implementation, the processor 210 may be a micro control unit (Micro-Controller Unit, MCU), the data signal may be a current value, and the control signal may be a diagnosis control signal or a transmit (Transmit, Tx)/receive (Receive, Rx) control signal. The current detection unit 230 may be configured to detect a current consumed on a power supply that supplies power to a relay. In specific implementation, the current detection unit 230 may be a single current detection chip, or may be an operational amplifier. FIG. 3 is a circuit diagram of the current detection unit 230. The variable power supply unit 240 may be configured to output different power supply voltages based on the control signal sent by the processor 210. In specific implementation, the variable power supply unit 240 may be implemented by using a single variable voltage chip, or may be implemented by a plurality of variable voltages with different output voltages by switching a switch, or may be implemented by changing an output voltage by switching a feedback resistance of a variable voltage. FIG. 4 is a circuit diagram of the variable power supply unit 240. The combiner/splitter unit 250 may be configured to combine or separate a power signal and a radio frequency signal. The power signal may include a variable power signal and a control signal that are output by the variable power supply unit 240. After the power signal and the radio frequency signal are combined in the in-vehicle terminal, a combined signal may be sent to a relay amplifier. FIG. 5 is a circuit diagram of the combiner/splitter unit 250. The combiner/splitter unit 250 may include a radio frequency filter 251 and a radio frequency notch filter 252. The radio frequency filter 251 may be configured to: isolate the power signal, and allow the radio frequency signal to pass through. The radio frequency notch filter 252 may be configured to: isolate the radio frequency signal, and allow the power signal to pass through. The radio frequency notch filter 252 may include a radio frequency ground capacitor 2521 and a quarter-wavelength impedance transformation line 2522. The radio frequency ground capacitor 2521 may provide a good ground characteristic for a required radio frequency working frequency. The radio frequency ground capacitor 2521 may include one or more capacitors. The radio frequency ground capacitor 2521 plus the quarter-wavelength impedance transformation line 2522 may be equivalent to an open circuit for the required radio frequency working frequency, to eliminate an impact on a radio frequency path and the radio frequency filter. The regulated power supply 220 may be configured to supply power to the relay amplifier. The radio frequency signal controller 260 may be configured to send and receive a radio frequency signal, that is, may send a radio frequency signal to the combiner/splitter unit 250, and may also receive a radio frequency signal from the combiner/splitter unit 250.

Figure 6:
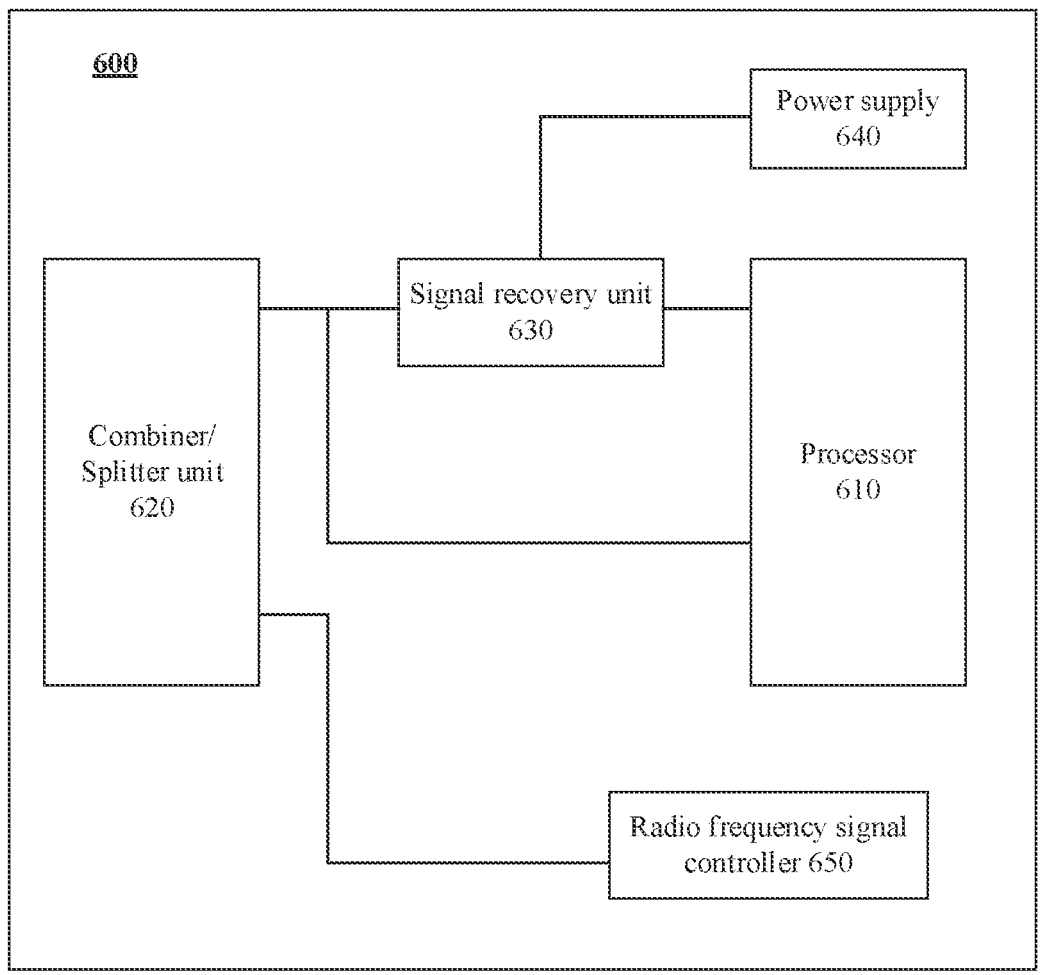
FIG. 6 is a schematic diagram of a structure of another embodiment of an electronic device according to this application.

FIG. 6 is a schematic diagram of a structure of an electronic device 600 according to an embodiment of this application. The electronic device may be a relay amplifier, and the electronic device 600 may include a processor 610, a combiner/splitter unit 620, a signal recovery unit 630, a power supply 640, and a radio frequency signal controller 650. The signal recovery unit 630 may be configured to recover a regulated power supply signal and a control signal from a power signal, and may send the regulated power supply signal to the power supply 640, and send the control signal to the processor 610. The power supply 640 may be configured to receive the regulated power supply signal sent by the signal recovery unit 630, to provide a voltage for a component in the electronic device 600. The combiner/splitter unit 620 is configured to: receive a power signal and a radio frequency signal of an in-vehicle terminal, separate the power signal and the radio frequency signal, send the power signal to the signal recovery unit 630, and send the radio frequency signal to the radio frequency signal controller 650. The processor 610 may be configured to control a state of the electronic device 600 based on the received control signal. The state may include a transmit state, a receive state, and a current load state. The radio frequency signal controller 650 may be configured to receive the radio frequency signal sent by the combiner/splitter unit 620, and may send the radio frequency signal by using an antenna.

Figure 7:
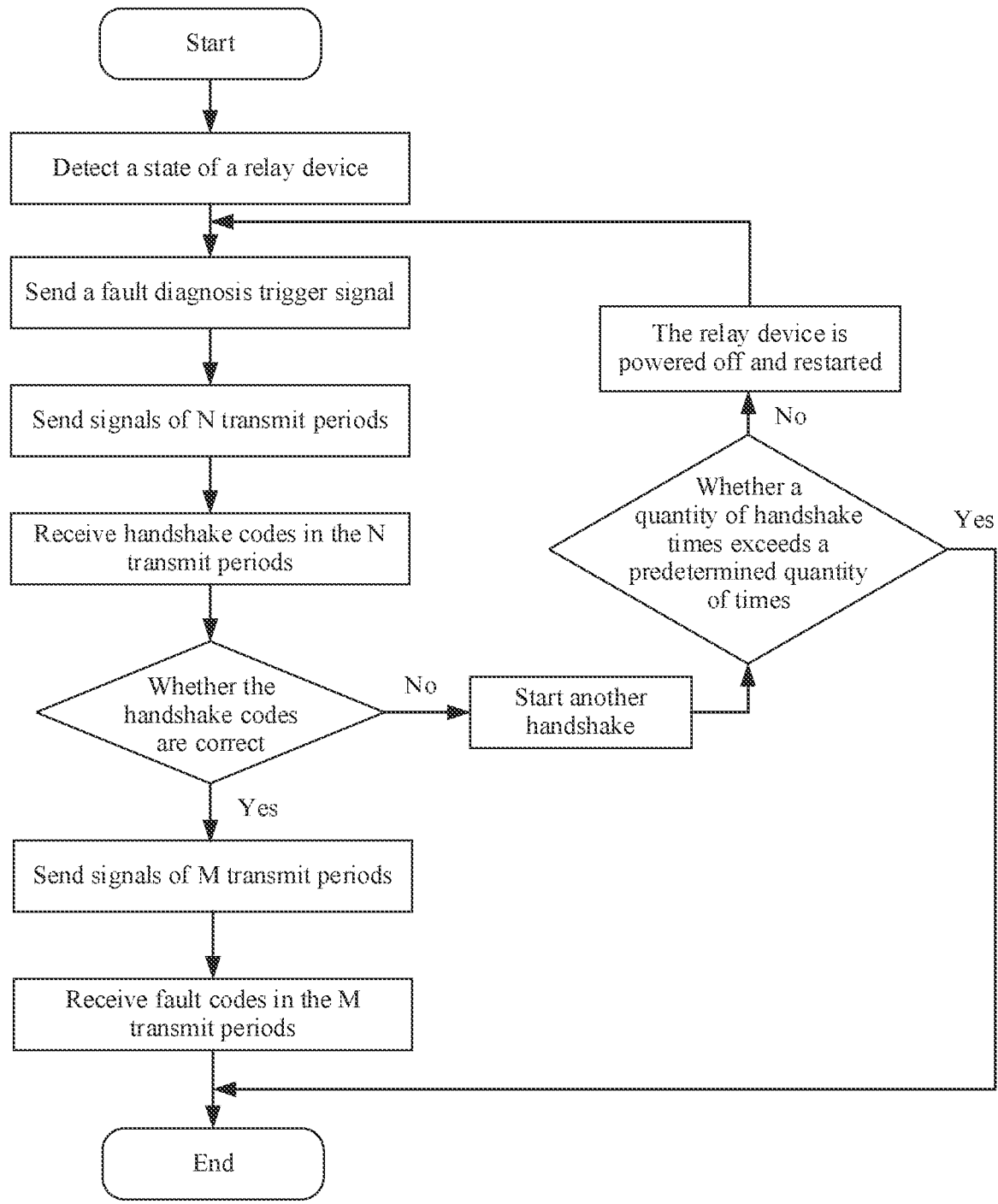
FIG. 7 is a schematic flowchart of a fault diagnosis method according to an embodiment of this application.

The fault diagnosis method provided in embodiments of this application is described with reference to FIG. 7 to FIG. 12. FIG. 7 is a flowchart of an embodiment of a fault diagnosis method according to this application. The method includes the following steps.

Step 701: Detect a state of a relay device, and send a fault diagnosis trigger signal to the relay device based on the state, so that the relay device enters a fault diagnosis mode.

Specifically, an in-vehicle terminal may detect the state of the relay device. The in-vehicle terminal may be a telematics box (Telematics Box, TBOX), or may be another type of vehicle head unit. The relay device may be a relay amplifier, or may be a relay component that performs signal compensation.

Figure 8:
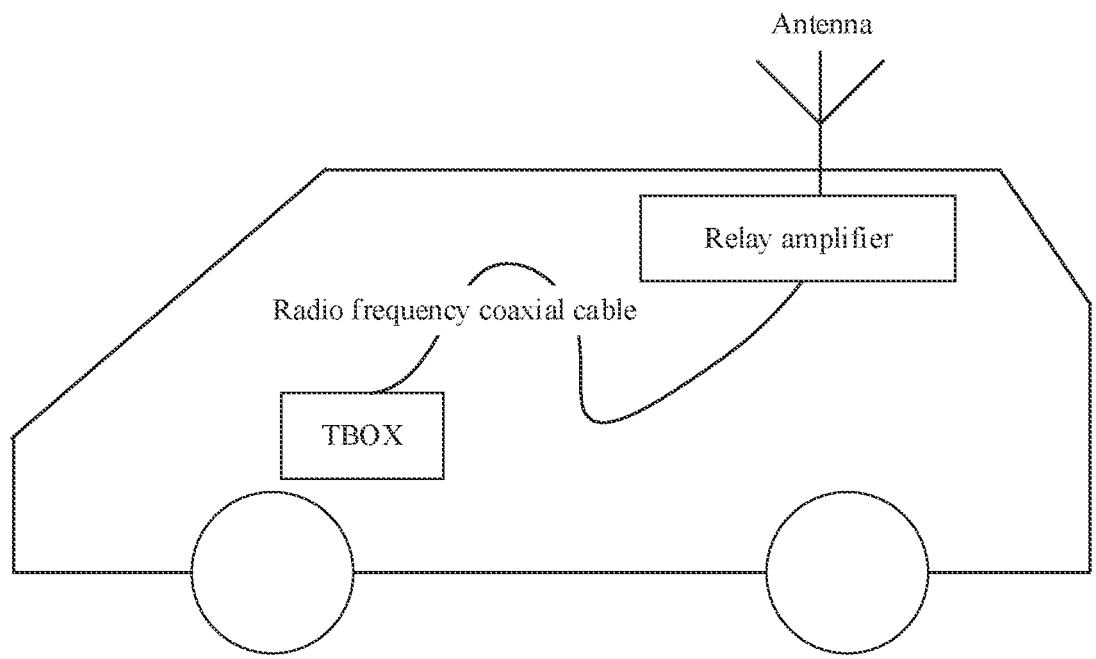
FIG. 8 is a diagram of a system architecture according to an embodiment of this application.

FIG. 8 shows a system architecture according to an embodiment of this application. In this system, after a communication signal of the TBOX is amplified by using the relay amplifier, the communication signal is sent by using an antenna mounted outside a vehicle. The TBOX is connected to the relay amplifier by using a radio frequency coaxial cable.

Figure 9:
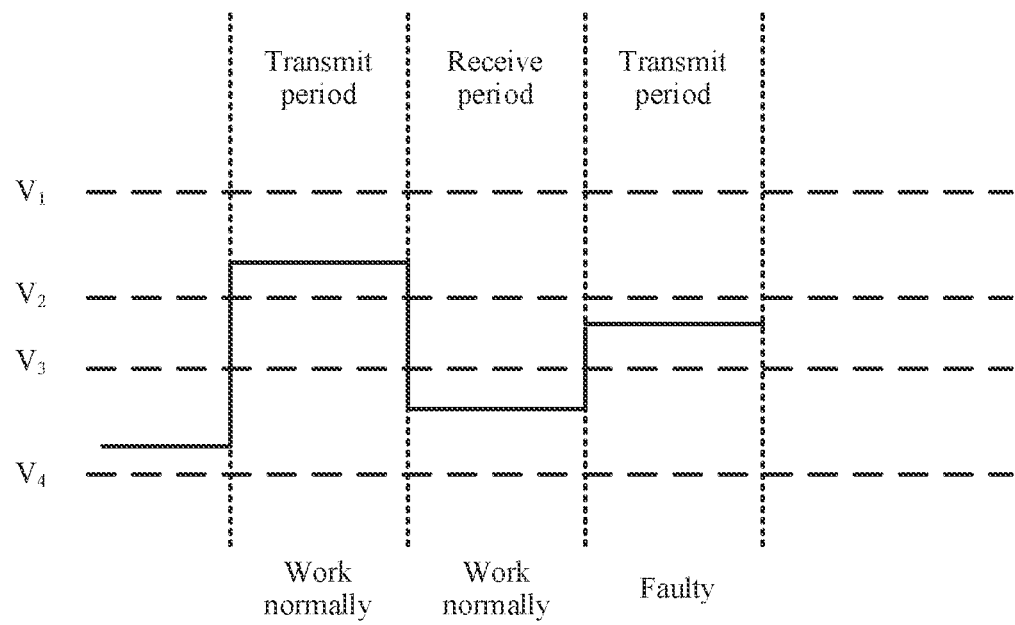
FIG. 9 is a schematic diagram of detecting a current state according to an embodiment of this application.

The state of the relay device may be detected by the in-vehicle terminal by performing current detection on a power supply that supplies power to the relay device. In this case, whether a connection between the in-vehicle terminal and the relay device is faulty may be determined. In specific implementation, as shown in FIG. 9, a current detection unit 230 of the in-vehicle terminal may separately detect a power supply current $V_{TX}$ of the relay device in a transmit period and a power supply current $V_{RX}$ of the relay device in a receive period. A processor 210 may compare $V_{TX}$ with an upper limit V1 and a lower limit V2 in the transmit period. If $V2 \leq V_{TX} \leq V1$, it may be considered that the relay device works normally. If $V1<V_{TX}$ or $V_{TX}<V2$, it may be considered that the relay device is faulty. Alternatively, the processor 210 may compare $V_{RX}$ with an upper limit V3 and a lower limit V4 in the receive period. If $V4 \leq V_{RX} \leq V3$, it may be considered that the relay device works normally. If $V3<V_{RX}$ or $V_{RX}<V4$, it may be considered that the relay device is faulty.

Further, after detecting that the relay device is faulty, the in-vehicle terminal may send the fault diagnosis trigger signal to the relay device. The fault diagnosis trigger signal may be used to trigger the relay device to enter the fault diagnosis mode. In this case, the relay device may send a fault code to the in-vehicle terminal. The fault diagnosis trigger signal may include one or more of a variable supply voltage value, a transmit/receive control signal, and a diagnosis control signal.

Figure 10:
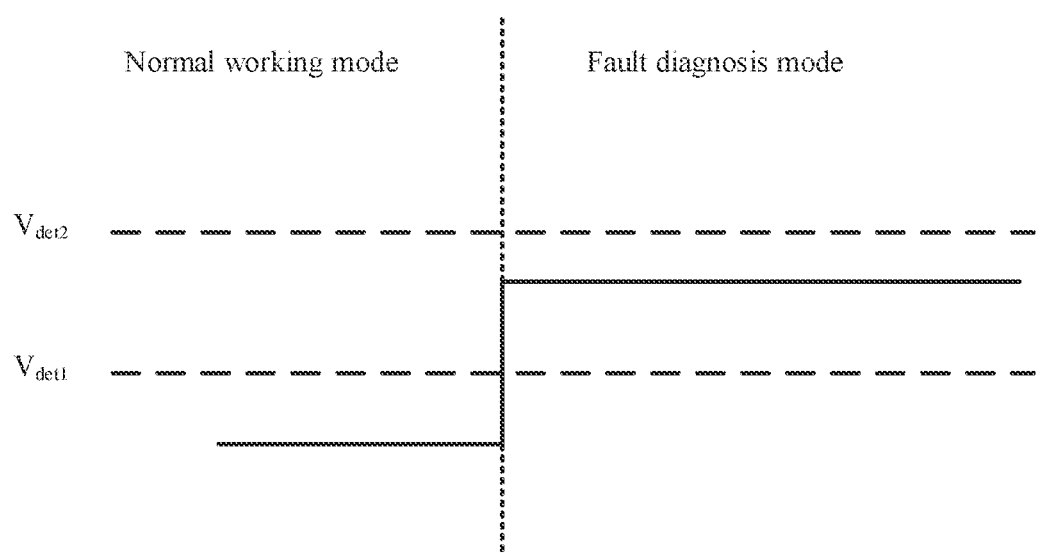
FIG. 10 is a schematic diagram of detecting a voltage according to an embodiment of this application.

Optionally, the relay device may enter the fault diagnosis mode by changing an output voltage by the in-vehicle terminal. In specific implementation, as shown in FIG. 10, a variable power supply unit 240 of the in-vehicle terminal may change an output voltage $V_{det}$, or may send the diagnosis control signal to the relay device. When a processor 610 of the relay device detects that a current variable supply voltage $V_{det}$ is between preset voltages $V_{det1}$ and $V_{det2}$, that is, $V_{det1} \leq V_{det} \leq V_{det2}$, or when a processor 610 detects a fault diagnosis trigger signal sent by a signal recovery unit 630, the relay device may enter the fault diagnosis mode.

Figure 11:
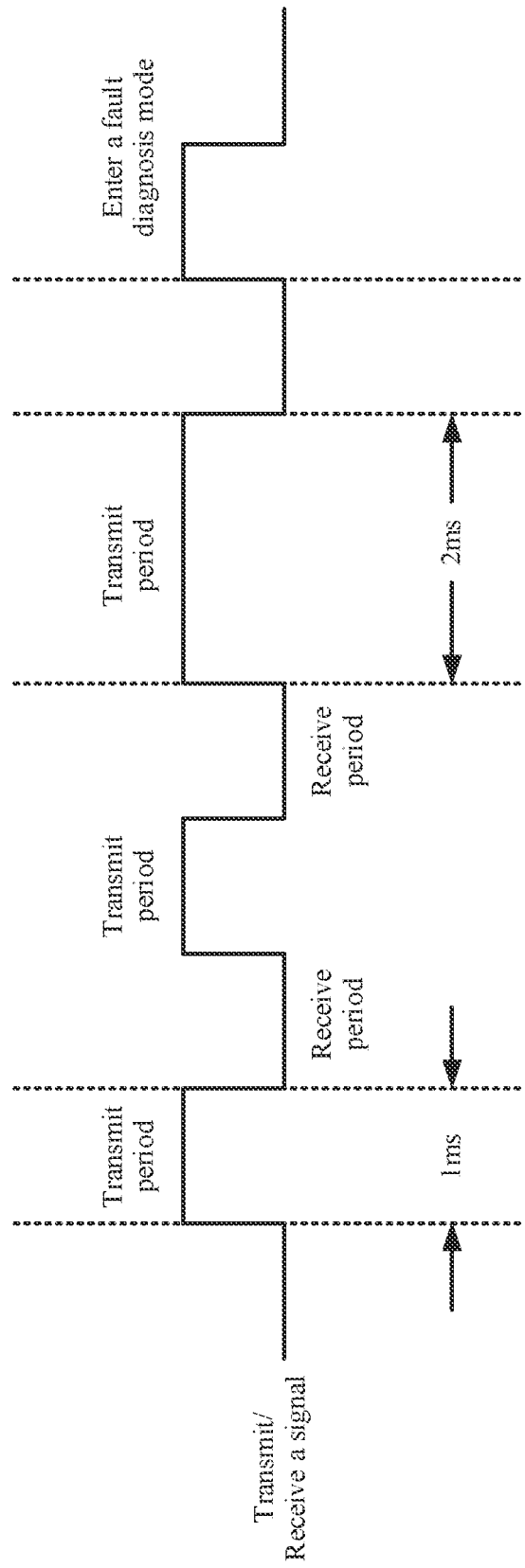
FIG. 11 is a schematic diagram of detecting an output duty cycle of a control signal according to an embodiment of this application.

Optionally, the relay device may enter the fault diagnosis mode by changing, by the in-vehicle terminal, an output duty cycle of the transmit/receive control signal in the transmit period. In specific implementation, as shown in FIG. 11, the processor 210 of the in-vehicle terminal may control duration of an output high level of the transmit/receive control signal, for example, may increase original duration 1 ms to 2 ms. If a processor 610 of the relay device detects that a duty cycle of a transmit/receive signal sent by the signal recovery unit 630 is 2 ms, or detects that a duty cycle of a variable supply voltage is changed to 2 ms, the relay device may enter the fault diagnosis mode.

Optionally, after power-on, the in-vehicle terminal may directly set a power supply voltage of the relay device to $V_{det}$, so that the relay device enters the fault diagnosis mode. Alternatively, after power-on, the in-vehicle terminal may change the output duty cycle of the transmit/receive control signal, so that the relay device enters the fault diagnosis mode. For example, in a scenario such as installation self-test or power-on self-test, after powering on the relay device each time, the in-vehicle terminal directly enables the relay device to enter the fault diagnosis mode.

Optionally, the relay device may detect a fault of the relay device and a fault of the antenna. If the relay device detects at least one of the fault of the relay device and the fault of the antenna fault, the relay device may actively turn off a transmit path. This causes abnormality of the transmit period. After detecting the abnormality of the transmit period, the in-vehicle terminal may set the power supply voltage of the relay device to $V_{det}$, so that the relay device enters the fault diagnosis mode. Alternatively, the in-vehicle terminal changes the output duty cycle of the transmit/receive control signal, so that the relay device enters the fault diagnosis mode. For example, in a scenario in which a radio frequency cable falls off an antenna falls off, or a relay is damaged, the relay device may actively turn off the transmit path, to notify the in-vehicle terminal that the current relay device is faulty. In this case, the in-vehicle terminal sends a signal to the relay device, so that the relay device enters the fault diagnosis mode.

Step 702: Detect a state of the relay device in the fault diagnosis mode, determine a fault code based on the state, and determine a fault based on the fault code.

Figure 12:
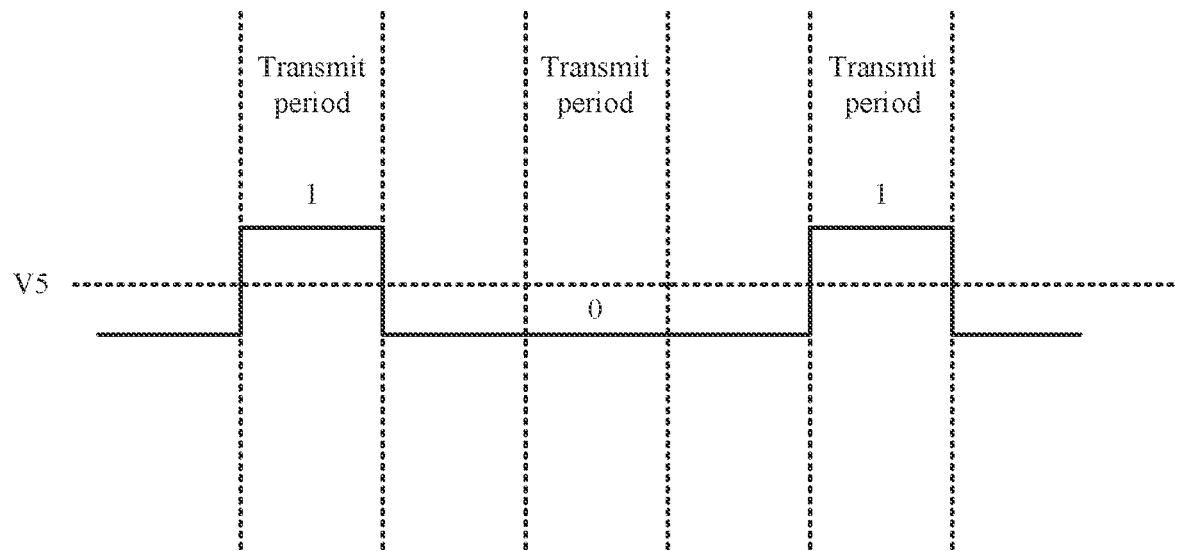
FIG. 12 is a schematic diagram of a fault code according to an embodiment of this application.

Specifically, after entering the fault diagnosis mode, the relay device may send the fault code to the in-vehicle terminal. The fault code may be implemented by detecting a power supply current of the relay device. In specific implementation, as shown in FIG. 12, in the fault diagnosis mode, the relay device may be in a transmit state, a receive state, or a current load state in each transmit period. The in-vehicle terminal may detect a power supply current VT of the relay device in each transmit period, and may compare the relay power supply current VT with a preset current threshold V5. If $V_{TX} \geq V5$, a code in the transmit period may be identified as 1. If $V_{TX}<V5$, a code in the transmit period may be identified as 0. In this case, codes in a plurality of transmit periods may be combined to form a fault code. The fault code may be associated with preset fault information. In this case, a corresponding fault may be determined based on the fault code.

Further, before sending the fault code, the relay device may further perform moment alignment with the in-vehicle terminal, to avoid mistakenly transmitting information. In specific implementation, after sending the fault diagnosis trigger signal to the relay device, the in-vehicle terminal may further send a signal of a transmit period to the relay device. After the relay device enters the fault diagnosis mode, if the relay device receives the signal of the transmit period from the in-vehicle terminal, the relay device may be controlled, in the transmit period, to be in a transmit state, a receive state, or a current load state, so as to send a handshake code to the in-vehicle terminal. The handshake code may be implemented in the foregoing power supply current detection manner. For example, the in-vehicle terminal may continuously send N transmit periods to the relay device, so that codes in the N consecutive transmit periods can be detected. It is assumed that N is set to 3 and the handshake code is set to 101. After three transmit periods, if the in-vehicle terminal detects a code 101, it may be considered that the handshake code is correct. In this case, the in-vehicle terminal may continue to send a signal of a transmit period to the relay amplifier, to detect the fault code of the relay device. After the relay device successfully performs a handshake with the in-vehicle terminal, the relay device may continue to send the fault code by controlling the power supply current value. For example, the in-vehicle terminal may continuously send M transmit periods to the relay device, so that codes in the M consecutive transmit periods can be detected. It is assumed that M is set to 5. In this case, after five transmit periods, if the in-vehicle terminal detects a code 10111, corresponding fault information may be queried based on the fault code 10111.

Further, if the in-vehicle terminal verifies that the handshake code of the relay device is incorrect, another handshake may be started. In specific implementation, after the in-vehicle terminal fails to perform a handshake with the relay device, the in-vehicle terminal may power off and restart the relay device, may send a fault diagnosis trigger signal to the relay device again, and send a signal of a transmit period after sending the fault diagnosis trigger signal, to perform a handshake with the relay device again. After receiving the fault diagnosis trigger signal, the relay device may adjust the power supply current again based on the signal of the transmit period of the in-vehicle terminal, so that the in-vehicle terminal can detect the handshake code. A maximum quantity of handshake times may be preset. If the quantity of handshake times exceeds a predetermined quantity of times, it may be considered that the relay is faulty and cannot communicate normally. Therefore, current diagnosis may be terminated.

Figure 13:
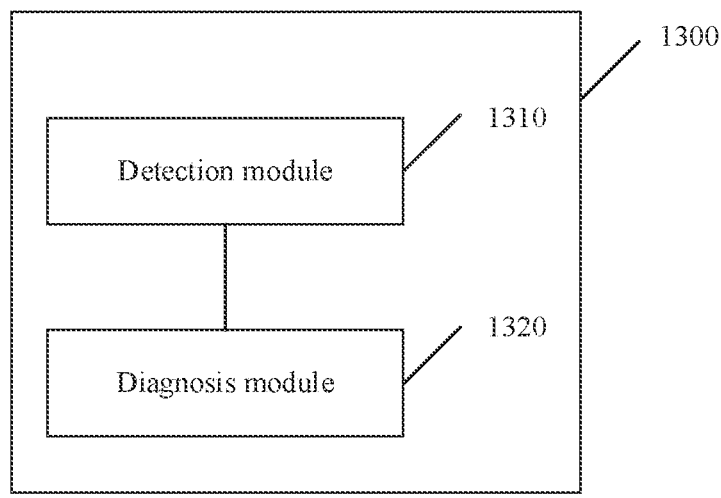
FIG. 13 is a schematic diagram of a fault diagnosis apparatus according to an embodiment of this application.

FIG. 13 is a schematic diagram of a structure of an embodiment of a fault diagnosis apparatus according to this application. As shown in FIG. 13, a fault diagnosis apparatus 1300 may include a detection module 1310 and a diagnosis module 1320.

The detection module 1310 is configured to: detect a state of a relay device, and send a fault diagnosis trigger signal to the relay device based on the state, so that the relay device enters a fault diagnosis mode, where the fault diagnosis trigger signal includes one or more of a variable supply voltage value, a transmit/receive control signal, and a diagnosis control signal.

The diagnosis module 1320 is configured to: detect a state of the relay device in the fault diagnosis mode, determine a fault code based on the state, and determine a fault based on the fault code.

In a possible implementation, the detection module 1310 may include a detection unit 1311 and a sending unit 1312.

The detection unit 1311 is configured to detect a relay power supply current $V_{TX}$ in any transmit period and a relay power supply current $V_{RX}$ in any receive period.

The sending unit 1312 is configured to: if $V_{TX}$ is less than a preset first threshold, or $V_{TX}$ is greater than a preset second threshold, or Vax is less than a preset third threshold, or Vax is greater than a preset fourth threshold, send the fault diagnosis trigger signal to the relay device.

In a possible implementation, the detection module 1310 may include a detection unit 1313 and a sending unit 1314.

The detection unit 1313 is configured to detect a state of a transmit path of the relay device in any transmit period.

The sending unit 1314 is configured to: if the transmit path is in an abnormal state, send the fault diagnosis trigger signal to the relay device.

In a possible implementation, the detection module 1310 may be further configured to: adjust the variable supply voltage value based on the state, and send the variable supply voltage value to the relay device; or adjust an output duty cycle of the transmit/receive control signal based on the state, and send the transmit/receive control signal to the relay device.

In a possible implementation, the diagnosis module 1320 may include a detection unit 1321, a comparison unit 1322, and a diagnosis unit 1323.

The detection unit 1321 is configured to detect a relay power supply current $V_{TX}$ of the relay device in any transmit period in the fault diagnosis mode.

The comparison unit 1322 is configured to: if $V_{TX}$ is less than a preset fifth threshold, determine a first code; or if $V_{TX}$ is greater than or equal to a preset fifth threshold, determine a second code.

The diagnosis unit 1323 is configured to: obtain a code set in M consecutive transmit periods, and determine the fault code based on the code set, where the code set includes at least one of the first code and the second code.

In a possible implementation, the diagnosis unit 1323 may include an obtaining subunit 13231, a matching subunit 13232, and a diagnosis subunit 13233.

The obtaining subunit 13231 is configured to obtain a first code set of the relay device from the first transmit period to an $N^{th}$ transmit period in the fault diagnosis mode, where the first code set includes at least one of the first code and the second code.

The matching subunit 13232 is configured to: if the first code set matches a preset code set, obtain a second code set from an $(N+1)^{th}$ transmit period to an $(N+M)^{th}$ transmit period, where the second code set includes at least one of the first code and the second code.

The diagnosis subunit 13233 is configured to determine the fault code based on the second code set.

The fault diagnosis apparatus provided in embodiment shown in FIG. 13 may be configured to execute the technical solutions of the method embodiments shown in FIG. 7 to FIG. 12 of this application. For implementation principles and technical effects of the fault diagnosis apparatus, refer to related descriptions in the method embodiments.

It should be understood that division of the modules of the fault diagnosis apparatus shown in FIG. 13 is merely division of logical functions. In actual implementation, all or some of the modules may be integrated into one physical entity, or the modules may be physically separated. In addition, all of the modules may be implemented in a form of software invoked by using a processing element, or may be implemented in a form of hardware; or some of the modules may be implemented in a form of software invoked by using a processing element, and some of the modules are implemented in a form of hardware. For example, the detection module may be a processing element that is separately disposed, or may be integrated into a chip of the electronic device for implementation. Implementations of the other modules are similar to the detection module. In addition, all or some of the modules may be integrated together, or may be implemented independently. In an implementation process, steps in the foregoing methods or the foregoing modules can be implemented by using a hardware integrated logical circuit in the processing element, or by using instructions in a form of software.

For example, the foregoing modules may be configured as one or more integrated circuits for implementing the foregoing method, for example, one or more application-specific integrated circuits (Application-Specific Integrated Circuit, ASIC for short), or one or more microprocessors (Digital Signal Processor, DSP for short), or one or more field programmable gate arrays (Field Programmable Gate Array, FPGA for short). For another example, the modules may be integrated together, and implemented in a form of a system-on-a-chip (System-On-a-Chip. SOC for short).

It may be understood that an interface connection relationship between the modules that is shown in this embodiment of the present disclosure is merely an example for description, and does not constitute a limitation on a structure of the electronic device 200. In some other embodiments of this application, the electronic device 200 may alternatively use an interface connection manner different from that in the foregoing embodiment, or use a combination of a plurality of interface connection manners.

It may be understood that, to implement the foregoing functions, the electronic device includes a corresponding hardware structure and/or software module for performing each function. A person skilled in the art should be easily aware that, in combination with the examples described in embodiments disclosed in this specification, units, algorithms, and steps may be implemented by hardware or a combination of hardware and computer software in embodiments of this application. Whether a function is performed by hardware or hardware driven by computer software depends on a particular application and a design constraint of the technical solutions. A person skilled in the art may use different methods to implement the described functions for each particular application, but it should not be considered that the implementation goes beyond the scope of embodiments of the present invention.

In embodiments of this application, the terminal may be divided into functional modules based on the foregoing method examples. For example, each functional module may be obtained through division based on each corresponding function, or two or more functions may be integrated into one processing module. The integrated module may be implemented in a form of hardware, or may be implemented in a form of a software functional module. It should be noted that, in embodiments of this application, division into the modules is an example and is merely logical function division, and may be other division in an actual implementation.

Based on the foregoing descriptions of the implementations, a person skilled in the art may clearly understand that for the purpose of convenient and brief descriptions, division into the foregoing functional modules is merely used as an example for descriptions. During actual application, the foregoing functions can be allocated to different functional modules for implementation based on a requirement, in other words, an inner structure of an apparatus is divided into different functional modules to implement all or a part of the functions described above. For a specific working process of the foregoing system, apparatus, and unit, refer to a corresponding process in the foregoing method embodiments, and details are not described herein again.

Functional units in embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of embodiments of this application essentially, or the part contributing to the conventional technology, or all or some of the technical solutions may be implemented in the form of a software product. The computer software product is stored in a storage medium and includes several instructions for instructing a computer device (which may be a personal computer, a server, or a network device) or a processor to perform all or some of the steps of the methods described in embodiments of this application. The foregoing storage medium includes any medium that can store program code, such as a flash memory, a removable hard disk, a read-only memory, a random access memory, a magnetic disk, or an optical disc.

The foregoing descriptions are only specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A method comprising:
   detecting a first state of a transmit path of a relay device in a transmit period through a radio frequency coaxial cable;
   sending, through the radio frequency coaxial cable and when the transmit path is in an abnormal state, a fault diagnosis trigger signal to the relay device to enable the relay device to enter a fault diagnosis mode, wherein the fault diagnosis trigger signal comprises one or more of a variable supply voltage value, a transmit/receive control signal, or a diagnosis control signal;
   detecting a second state of the relay device in the fault diagnosis mode through the radio frequency coaxial cable; and
   determining a fault based on a fault code,
   wherein the fault code is based on the second state.

2. The method of claim 1, wherein detecting the first state comprises detecting a first relay power supply current ($V_{TX}$) in the transmit period and a second relay power supply current ($V_{RX}$) in a receive period, and wherein the method further comprises further sending the fault diagnosis trigger signal to the relay device when $V_{TX}$ is less than a preset first threshold, $V_{TX}$ is greater than a preset second threshold, $V_{RX}$ is less than a preset third threshold, or $V_{RX}$ is greater than a preset fourth threshold.

3. The method of claim 1, wherein the abnormal state comprises that the transmit path is in a disconnected state.

4. The method of claim 1, further comprising adjusting the variable supply voltage value based on the first state to obtain an adjusted variable supply voltage value, wherein sending the fault diagnosis trigger signal comprises sending the adjusted variable supply voltage value to the relay device.

5. The method of claim 1, further comprising adjusting an output duty cycle of the transmit/receive control signal based on the first state to obtain an adjusted transmit/receive control signal, wherein sending the fault diagnosis trigger signal comprises sending the adjusted transmit/receive control signal to the relay device.

6. The method of claim 1, wherein detecting the second state comprises detecting a relay power supply current ($V_{TX}$) of the relay device in the transmit period in the fault diagnosis mode, and wherein determining the fault code comprises:
   determining a first code when $V_{TX}$ is less than a preset threshold;
   determining a second code when $V_{TX}$ is greater than or equal to the preset threshold;
   obtaining a code set in M consecutive transmit periods, wherein the code set comprises at least one of the first code or the second code; and
   determining the fault code based on the code set.

7. The method of claim 6, wherein obtaining the code set comprises:
   obtaining a first code set of the relay device from a first transmit period to an $N^{th}$ transmit period in the fault diagnosis mode, wherein the first code set comprises at least one of the first code or the second code; and
   obtaining a second code set from an $(N+1)^{th}$ transmit period to an $(N+M)^{th}$ transmit period when the first code set matches a preset code set, wherein the second code set comprises at least one of the first code or the second code, and
   wherein the method further comprises further determining the fault code based on the second code set.

8. An electronic device comprising:
   a memory configured to store instructions; and
   a processor coupled to the memory and configured to execute the instructions to cause the electronic device to:
   detect a first state of a transmit path of a relay device in a transmit period through a radio frequency coaxial cable;
   send, through the radio frequency coaxial cable and when the transmit path is in an abnormal state, a fault diagnosis trigger signal to the relay device to enable the relay device to enter a fault diagnosis mode, wherein the fault diagnosis trigger signal comprises one or more of a variable supply voltage value, a transmit/receive control signal, or a diagnosis control signal;

detect a second state of the relay device in the fault diagnosis mode through the radio frequency coaxial cable; and determine a fault based on a fault code, wherein the fault code is based on the second state.

9. The electronic device of claim 8, wherein the processor is further configured to execute the instructions to cause the electronic device to:

detect a first relay power supply current ($V_{TX}$) in the transmit period and a second relay power supply current ($V_{RX}$) in a receive period; and further send the fault diagnosis trigger signal to the relay device when $V_{TX}$ is less than a preset first threshold, $V_{TX}$ is greater than a preset second threshold, $V_{RX}$ is less than a preset third threshold, or $V_{RX}$ is greater than a preset fourth threshold.

10. The electronic device of claim 8, wherein the abnormal state comprises that the transmit path is in a disconnected state.

11. The electronic device of claim 8, wherein the processor is further configured to execute the instructions to cause the electronic device to adjust the variable supply voltage value based on the first state to obtain an adjusted variable supply voltage value, and wherein the adjusted variable supply voltage value is the fault diagnosis trigger signal.

12. The electronic device of claim 8, wherein the processor is further configured to execute the instructions to cause the electronic device to adjust an output duty cycle of the transmit/receive control signal based on the first state to obtain an adjusted transmit/receive control signal, and wherein the adjusted transmit/receive control signal is the fault diagnosis trigger signal.

13. The electronic device of claim 8, wherein the processor is further configured to execute the instructions to cause the electronic device to:

detect a relay power supply current ($V_{TX}$) of the relay device in the transmit period in the fault diagnosis mode;

determine a first code when $V_{TX}$ is less than a preset threshold;

determine a second code when $V_{TX}$ is greater than or equal to the preset threshold;

obtain a code set in M consecutive transmit periods, wherein the code set comprises at least one of the first code or the second code; and determine the fault code based on the code set.

14. The electronic device of claim 13, wherein the processor is further configured to execute the instructions to cause the electronic device to:

obtain a first code set of the relay device from a first transmit period to an $N^{th}$ transmit period in the fault diagnosis mode, wherein the first code set comprises at least one of the first code or the second code;

obtain a second code set from an $(N+1)^{th}$ transmit period to an $(N+M)^{th}$ transmit period when the first code set matches a preset code set, wherein the second code set comprises at least one of the first code or the second code; and further determine the fault code based on the second code set.

15. A computer program product comprising computer-executable instructions that are stored on a non-transitory computer-readable storage medium and that, when executed by a processor, cause an electronic device to:

detect a first state of a transmit path of a relay device in a transmit period through a radio frequency coaxial cable;

send, through the radio frequency coaxial cable and when the transmit path is in an abnormal state, a fault diagnosis trigger signal to the relay device to enable the relay device to enter a fault diagnosis mode, wherein the fault diagnosis trigger signal comprises one or more of a variable supply voltage value, a transmit/receive control signal, or a diagnosis control signal;

detect a second state of the relay device in the fault diagnosis mode through the radio frequency coaxial cable; and determine a fault based on a fault code, wherein the fault code is based on the second state.

16. The computer program product of claim 15, wherein the computer-executable instructions further cause the electronic device to:

detect a first relay power supply current ($V_{TX}$) in the transmit period and a second relay power supply current ($V_{RX}$) in a receive period; and further send the fault diagnosis trigger signal to the relay device when $V_{TX}$ is less than a preset first threshold, $V_{TX}$ is greater than a preset second threshold, $V_{RX}$ is less than a preset third threshold, or $V_{RX}$ is greater than a preset fourth threshold.

17. The computer program product of claim 15, wherein the abnormal state comprises that the transmit path is in a disconnected state.

18. The computer program product of claim 15, wherein the computer-executable instructions further cause the electronic device to adjust the variable supply voltage value based on the first state to obtain an adjusted variable supply voltage value, and wherein the adjusted variable supply voltage value is the fault diagnosis trigger signal.

19. The computer program product of claim 15, wherein the computer-executable instructions further cause the electronic device to adjust an output duty cycle of the transmit/receive control signal based on the first state to obtain an adjusted transmit/receive control signal, and wherein the adjusted transmit/receive control signal is the fault diagnosis trigger signal.

20. The computer program product of claim 15, wherein the computer-executable instructions further cause the electronic device to:

detect a relay power supply current ($V_{TX}$) of the relay device in the transmit period in the fault diagnosis mode;

determine a first code when $V_{TX}$ is less than a preset threshold;

determine a second code when $V_{TX}$ is greater than or equal to the preset threshold;

obtain a code set in M consecutive transmit periods, wherein the code set comprises at least one of the first code or the second code; and further determine the fault code based on the code set.

* * * * *